(12) United States Patent
Myung et al.

(10) Patent No.: US 12,198,775 B2
(45) Date of Patent: Jan. 14, 2025

(54) MEMORY AND METHOD WITH IN-MEMORY COMPUTING DEFECT DETECTION

(71) Applicant: SAMSUNG ELECTRONICS CO., LTD., Suwon-si (KR)

(72) Inventors: Sungmeen Myung, Suwon-si (KR); Seok Ju Yun, Suwon-si (KR); Jaehyuk Lee, Suwon-si (KR); Seungchul Jung, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 187 days.

(21) Appl. No.: 18/091,258

(22) Filed: Dec. 29, 2022

(65) Prior Publication Data

US 2024/0071548 A1    Feb. 29, 2024

(30) Foreign Application Priority Data

Aug. 26, 2022   (KR) .......................... 10-2022-0107923

(51) Int. Cl.
*G11C 13/00*    (2006.01)
*G11C 29/00*    (2006.01)
(Continued)

(52) U.S. Cl.
CPC .............. *G11C 29/36* (2013.01); *G11C 29/44* (2013.01); *G11C 29/785* (2013.01); *G11C 13/00* (2013.01); *G11C 2029/3602* (2013.01)

(58) Field of Classification Search
CPC ................................................ G11C 13/0002
See application file for complete search history.

(56) References Cited

U.S. PATENT DOCUMENTS

2018/0358110 A1   12/2018   Buyuktosunoglu et al.
2019/0073259 A1   3/2019    Qin et al.
(Continued)

FOREIGN PATENT DOCUMENTS

KR   10-2014-0125981 A   10/2014
KR   10-1836748 B1       3/2018
(Continued)

OTHER PUBLICATIONS

Zhi, Ruoyu, et al. "Opportunities and Limitations of in-Memory Multiply-and-Accumulate Arrays." 2021 IEEE Microelectronics Design & Test Symposium (MDTS). IEEE, 2021, (6 pages).
(Continued)

*Primary Examiner* — Jason Lappas
(74) *Attorney, Agent, or Firm* — NSIP Law

(57) ABSTRACT

A method and memory device with in-memory computing defection detection is disclosed. A memory device includes a memory including banks, wherein each bank includes a respective plurality of bit-cells, an in-memory computation (IMC) operator configured to perform an IMC operation between first data while the first data is in the bit-cells of the memory and second data received as input to the memory device, wherein the banks share the operator, and wherein the memory device is configured to: generate a first test pattern that is stored in the memory and generate a second test pattern applied to the IMC operator, and based thereon determine whether a defect has occurred in either the memory or the operator, and perform a repair based on the determination that a defect has occurred.

25 Claims, 10 Drawing Sheets

(51) Int. Cl.
  *G11C 29/36*   (2006.01)
  *G11C 29/44*   (2006.01)

(56) References Cited

U.S. PATENT DOCUMENTS

| | | |
|---|---|---|
| 2019/0102359 A1 | 4/2019 | Knag et al. |
| 2020/0233923 A1 | 7/2020 | Knag et al. |
| 2021/0132909 A1 | 5/2021 | Lee |
| 2022/0005527 A1* | 1/2022 | Nazarian ............ G11C 13/0002 |
| 2022/0100601 A1 | 3/2022 | Baum et al. |

FOREIGN PATENT DOCUMENTS

| | | |
|---|---|---|
| KR | 10-2135470 B1 | 7/2020 |
| KR | 10-2021-0109085 A | 9/2021 |

OTHER PUBLICATIONS

Extended European search report issued on Jan. 25, 2024, in counterpart European Patent Application No. 23160690.6 (11 pages).

\* cited by examiner

MEMORY AND METHOD WITH IN-MEMORY COMPUTING DEFECT DETECTION

CROSS-REFERENCE TO RELATED APPLICATIONS

This application claims the benefit under 35 USC § 119(a) of Korean Patent Application No. 10-2022-0107923, filed on Aug. 26, 2022, in the Korean Intellectual Property Office, the entire disclosure of which is incorporated herein by reference for all purposes.

BACKGROUND

1. Field

The following description relates to a memory and method with in-memory computing defect detection.

2. Description of Related Art

A vector matrix multiplication operation, also known as a multiply and accumulate (MAC) operation, is used by many applications in various fields, and the efficiency of MAC operations bears on the performance of such applications. For example, MAC operations may be performed for machine learning and authentication of multi-layer neural networks. An input signal to be processed by MAC operations may be in the form of an input vector, images or data derived therefrom, byte streams, or other data sets. An input signal may be multiplied by a weight of a neural network node of a given network layer, for example, and an output vector may be obtained from a result of accumulated MAC operations. The output vector may be provided as an input vector for a layer subsequent to the given network layer. Since the MAC operation is usually repeated for multiple layers, the overall neural network processing performance (e.g., in training or producing an inference) is mainly determined by the performance of the MAC operation. The MAC operation may be implemented through in-memory computing.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a memory device includes a memory including banks, wherein each bank includes a respective plurality of bit-cells, an in-memory computation (IMC) operator configured to perform an IMC operation between first data while the first data is in the bit-cells of the memory and second data received as input to the memory device, wherein the banks share the operator, and wherein the memory device is configured to: generate a first test pattern that is stored in the memory and generate a second test pattern applied to the IMC operator, and based thereon determine whether a defect has occurred in either the memory or the operator, and perform a repair based on the determination that a defect has occurred.

The memory device may be further may be configured to store the first test pattern in the bit-cells of the memory and apply the second test pattern to the IMC operator, and wherein the IMC operator may be further may be configured to receive the first test pattern from the memory and perform a test operation between the first test pattern and the second test pattern.

The memory device may be further configured to obtain a result of the test operation from the IMC operator and determine based thereon whether an operation error of the result of the test operation may have occurred for each of the banks.

The memory device may be further configured to, in response to determining that an operation error has not occurred, determine that no defect has occurred in the memory and no defect has occurred in the operator.

The memory device may be further configured to, in association with determining that an operation error has occurred, based on a same type of error occurring in each of the banks, determine that the defect has occurred in the operator.

The memory device may be further configured to repair a column corresponding to the operator, based on the determination that the defect has occurred in the IMC operator.

The memory device may be further configured to exclude a column comprising the IMC operator from further performing the IMC operation based on the determination that the defect has occurred in the IMC operator.

The memory device may be further configured to, based on determining that the operation error has occurred, based on a same type of error not occurring in each of the banks, determine that the defect has occurred in the memory.

The memory device may be further configured to detect a defective bit-cell based on the determination that a defect has occurred in the memory and determine a repairing method corresponding to the defective bit-cell.

Each of the banks may respectively include one or more redundant bit-cells, and the memory device may be configured to allocate a row corresponding to the defective bit-cell to a row comprising a redundant bit-cell.

Each of the banks may respectively include one or more redundant bit-cells, and the memory device may be configured to allocate a row corresponding to the defective bit-cell to a row may further include a redundant bit-cell.

The memory may further include a redundant bank, and the memory device may be configured to allocate a bank corresponding to the defective bit-cell to the redundant bank.

The memory may further include a redundant column, and the repairer may be configured to allocate a column corresponding to the defective bit-cell to the redundant column.

In one general aspect, a method of operating a memory device includes an operator and a memory that includes banks, the method includes receiving a result of a test operation, based on the result, determining whether an operation error may have occurred for each of the banks, in response to determining that the operation error may have occurred, determining an operation error type for of each of the plurality of banks, and determining whether there is a defect in of either the memory or the operator based on whether the same operation error type may have occurred in bit-cells included in the banks.

The operator may be configured to perform a computation operation directly on each of the banks.

When determined that the same error type has occurred in the bit-cells included in the banks, determining that the defect may have occurred in the operator.

The method may further include repairing a column corresponding to the operator based on the determination that the defect has occurred in the operator.

The method may further include excluding a column corresponding to the operator from an operation based on the determination that the defect has occurred in the operator.

The determining of whether there may be a defect may include, based on the same operation error type not occurring in each of the plurality of banks, determining that there is a defect in the memory.

The method may further include detecting a defective bit-cell based on the determination that there is a defect in the memory, and allocating a component corresponding to the defective bit-cell to a redundant component of the memory device.

In one general aspect, there is provided a method of operating a memory device comprising a memory include banks, the banks include bit-cells, an operator, and a redundant bit-cell, and the method includes: receiving a primary test operation result; for each of the banks, determining whether an operation error of the primary test operation result has occurred, and based thereon, detecting a defective bit-cell of one of the banks; allocating the detected defective bit-cell to the redundant bit-cell; receiving a result of a secondary test operation performed obtained using the redundant bit-cell; and based on the result of the secondary test operation, determining whether a defect has occurred in the memory or in the operator.

The determining of whether a defect has occurred may include, based an operation error of the result of the secondary test operation, determining that a defect may have occurred in the operator.

The method may further include repairing a column corresponding to the operator based on the determination that the defect has occurred in the operator.

The method may further include excluding a column corresponding to the operator from an operation, based on the determination that the defect has occurred in the operator.

A non-transitory computer-readable storage medium storing instructions that, when executed by a processor, cause the processor to perform any of the methods.

Other features and aspects will be apparent from the following detailed description, the drawings, and the claims.

Figure 1:
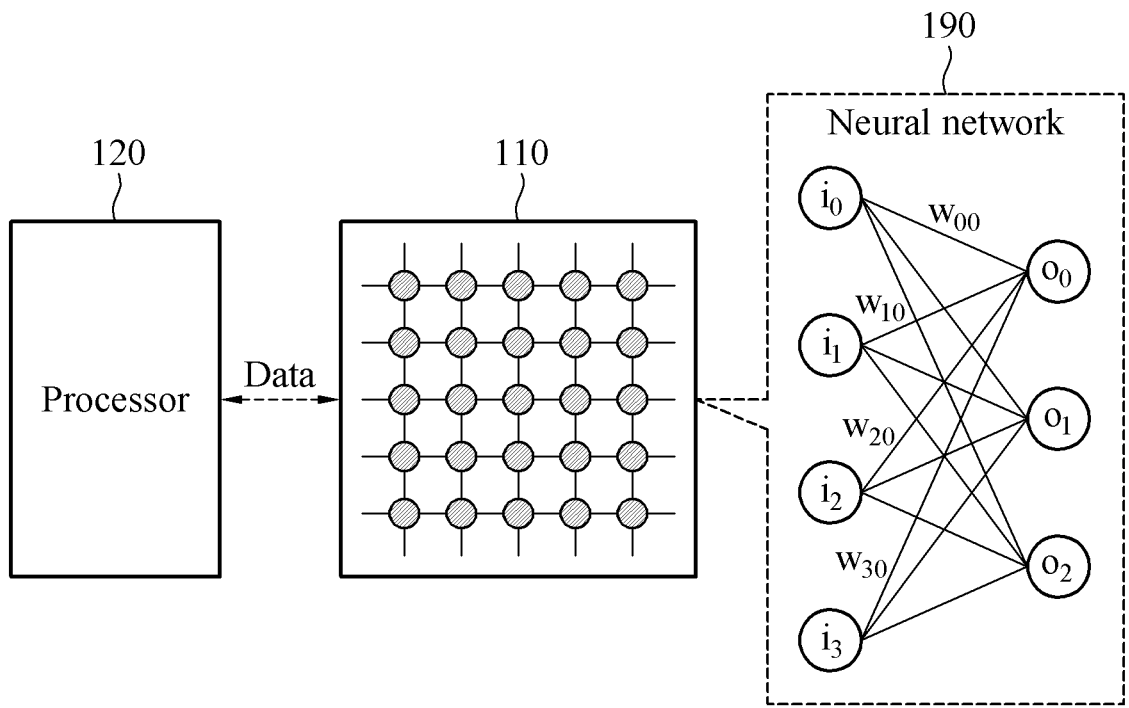
FIG. 1 illustrates an example of an in-memory computing (IMC) system of a multiply and accumulate (MAC) operation of a neural network, according to one or more embodiments.

Throughout the drawings and the detailed description, unless otherwise described or provided, the same or like drawing reference numerals will be understood to refer to the same or like elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known after an understanding of the disclosure of this application may be omitted for increased clarity and conciseness.

The features described herein may be embodied in different forms and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

The terminology used herein is for describing various examples only and is not to be used to limit the disclosure. The articles "a," "an," and "the" are intended to include the plural forms as well, unless the context clearly indicates otherwise. As used herein, the term "and/or" includes any one and any combination of any two or more of the associated listed items. As non-limiting examples, terms "comprise" or "comprises," "include" or "includes," and "have" or "has" specify the presence of stated features, numbers, operations, members, elements, and/or combinations thereof, but do not preclude the presence or addition of one or more other features, numbers, operations, members, elements, and/or combinations thereof.

Throughout the specification, when a component or element is described as being "connected to," "coupled to," or "joined to" another component or element, it may be directly "connected to," "coupled to," or "joined to" the other component or element, or there may reasonably be one or more other components or elements intervening therebetween. When a component or element is described as being "directly connected to," "directly coupled to," or "directly joined to" another component or element, there can be no other elements intervening therebetween. Likewise, expressions, for example, "between" and "immediately between" and "adjacent to" and "immediately adjacent to" may also be construed as described in the foregoing.

Although terms such as "first," "second," and "third", or A, B, (a), (b), and the like may be used herein to describe various members, components, regions, layers, or sections, these members, components, regions, layers, or sections are not to be limited by these terms. Each of these terminologies is not used to define an essence, order, or sequence of corresponding members, components, regions, layers, or sections, for example, but used merely to distinguish the corresponding members, components, regions, layers, or sections from other members, components, regions, layers, or sections. Thus, a first member, component, region, layer, or section referred to in the examples described herein may also be referred to as a second member, component, region, layer, or section without departing from the teachings of the examples.

Unless otherwise defined, all terms, including technical and scientific terms, used herein have the same meaning as commonly understood by one of ordinary skill in the art to which this disclosure pertains and based on an understanding of the disclosure of the present application. Terms, such as those defined in commonly used dictionaries, are to be interpreted as having a meaning that is consistent with their meaning in the context of the relevant art and the disclosure of the present application and are not to be interpreted in an idealized or overly formal sense unless expressly so defined herein. The use of the term "may" herein with respect to an example or embodiment, e.g., as to what an example or embodiment may include or implement, means that at least one example or embodiment exists where such a feature is included or implemented, while all examples are not limited thereto.

FIG. 1 illustrates an example of an in-memory computing (IMC) system of a multiply and accumulate (MAC) operation of a neural network, according to one or more embodiments.

In Von Neumann architecture processors, performance and power limitations occur due to frequent data movement between processor and memory. IMC architectures allow operations to be performed directly in a memory storing data (i.e., directly on the data as it remains in the memory), and may thus reduce data movement between a processor 120 and a memory device 110 and also increase power efficiency. The processor 120 of the IMC system 100 according to an example may input data to be operated to the memory device 110, and the memory device 110 may perform an operation by itself on the inputted data. The processor 120 may read a result of the operation from the memory device 110. Therefore, the data transmission during an operation process may be minimized. Although FIG. 1 shows discrete processing and storage components, in practice, the illustrated functional boundaries may not be well-defined; circuitry for processing and circuitry for data storage may be closely integrated and some circuit elements may have both storage and processing functionality.

For example, the IMC system 100 may frequently perform a MAC operation used in an artificial intelligence (AI) algorithm among various operations. As shown in FIG. 1, a layer operation 190 in a neural network may include a MAC operation of adding results obtained by multiplying weights by each of inputs of input nodes. An example of a MAC operation is expressed as in Equation 1 below.

$$O_0 = \sum_{m=0}^{M-1} I_m W_{0,m}, O_1 = \sum_{m=0}^{M-1} I_m W_{1,m}, \ldots,$$
$$O_{T-1} = \sum_{m=0}^{M-1} I_m W_{T-1,m}$$

Equation 1

In Equation 1, for a current network layer, there are M inputs provided to each of T nodes of the current layer. In Equation 1, $O_t$ represents an output of a t-th of the T nodes, $I_m$ represents an m-th of the M inputs, and $W_{t,m}$ represents a weight applied to an m-th input which is input to the t-th node. Here, $O_t$ is an output of a node or a node value and may be calculated as a weighted sum of an inputs $I_m$ and weights $W_{t,m}$. Here, m is an integer of 0 or more and M−1 or less, t is an integer of 0 or more and T−1 or less, and M and T are integers. M is the number of nodes of a previous layer connected to one node of the current layer to be operated (e.g., with MAC operations), and T is the number of nodes of the current layer. The memory device 110 of the IMC system 100 according to an example may perform the MAC operation described above. The memory device 110 may also be referred to as a resistive memory device, a memory array, or an IMC device.

IMC systems may be generally divided into analog IMC systems and digital IMC systems. An analog IMC system may perform a MAC operation in an analog domain including a current, charge, or time domain. For example, a digital IMC system may perform a MAC operation by using a logic circuit. Digital IMC systems may be implemented with an advanced process and exhibit excellent performance. The memory device 110 according to an example may have a static random-access memory (SRAM) including a plurality of transistors (e.g., six transistors). The SRAM composed of six transistors may also be referred to as a 6T SRAM. Since the SRAM stores data as a logic value of 0 or 1, a domain conversion process is not required. However, the memory device 110 is not limited to being used for the MAC operation, and the memory device 110 may be used to store the memory and drive other algorithms, for example a multiplication operation. Computing structures for the memory device 110 to perform operations directly in the memory without necessarily moving data are described below.

Figure 2:
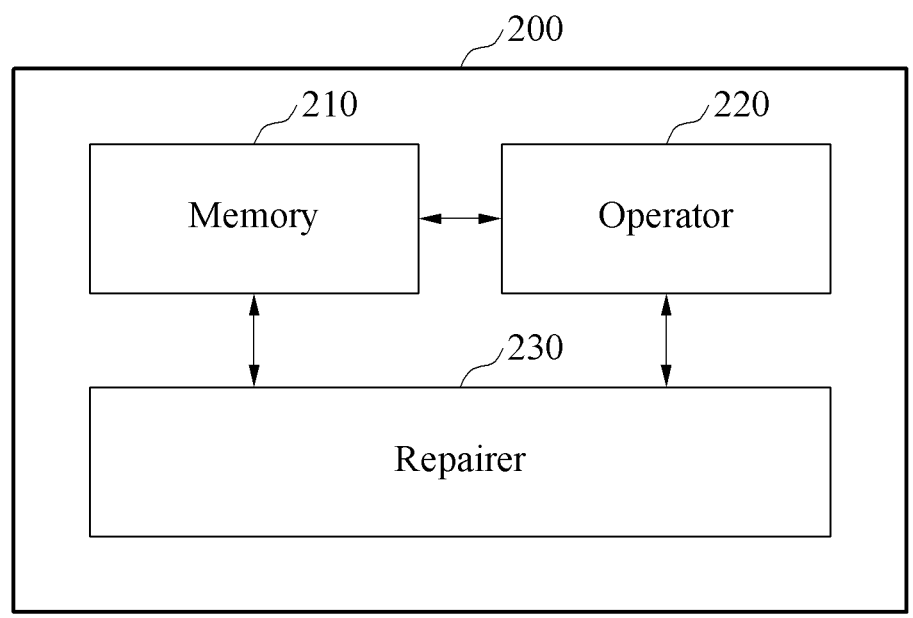
FIG. 2 illustrates an example configuration of a memory device in an IMC system, according to one or more embodiments.

FIG. 2 illustrates an example configuration of a memory device in an IMC system, according to one or more embodiments.

Referring to FIG. 2, a memory device 200 (e.g., the memory device 110 of FIG. 1) according to an example may include a memory 210, an operator 220, and a repairer 230. The suffixes such as "-er," "-or," etc. of such components, as used hereinafter, may refer to a part for processing at least one function or operation and may be implemented as hardware, executable code/instructions, or a combination of hardware and executable code/instructions.

In a digital IMC system and/or circuit, operations (computation) may be performed with most or all pieces of data stored therein, which are expressed as logic values, and thus an input value, weight, and output value may all have a binary format. The components described with reference to FIG. 2 may be implemented based on a digital logic circuit.

The memory 210 according to an example may be composed of bit-cells, each of which may store a respective bit data (e.g., a bit weight). Hereinafter, for convenience of description, the memory 210 according to an example are described based on the configuration of SRAM bit-cells, although suitability to other types of memory will be apparent.

The memory device 200 according to an example may perform the MAC operation through the operator 220. The operator 220 according to an example may include a multiplier, an adder tree, and an accumulator. In some implementations the operator 220 may be an in-memory computing (IMC) operator configured in known ways to perform an IMC operation such as, for example, a MAC operation.

The SRAM may be configured with a transistor size selected to maximize a memory density (bit/mm^2). As the bit-cell is configured with a minimal transistor size, the bit-cell is greatly affected by the variation that occurs during semiconductor fabrication, which may lead to read/write failures.

The memory device 200 according to an example may detect whether the memory 210 or the operator 220 is defective and repair the defect by using the repairer 230 ("repair" does not imply that the point of defect is physically altered to a non-defective state, but rather "repair" is used herein to express remediation of the effect of a defect in the overall memory device). For example, the repairer 230 according to an example may determine whether the memory device 200 is defective, and when the memory device 200 is defective, the repairer 230 may determine which of the memory 210 and the operator 220 is defective, and may accordingly determine an optimal repairing method for a defective location. Hereinafter, methods of determining a defect and methods of performing a repair based on the determination that a defect has occurred according to an example are described with reference to FIGS. 3 to 10.

Figure 3:
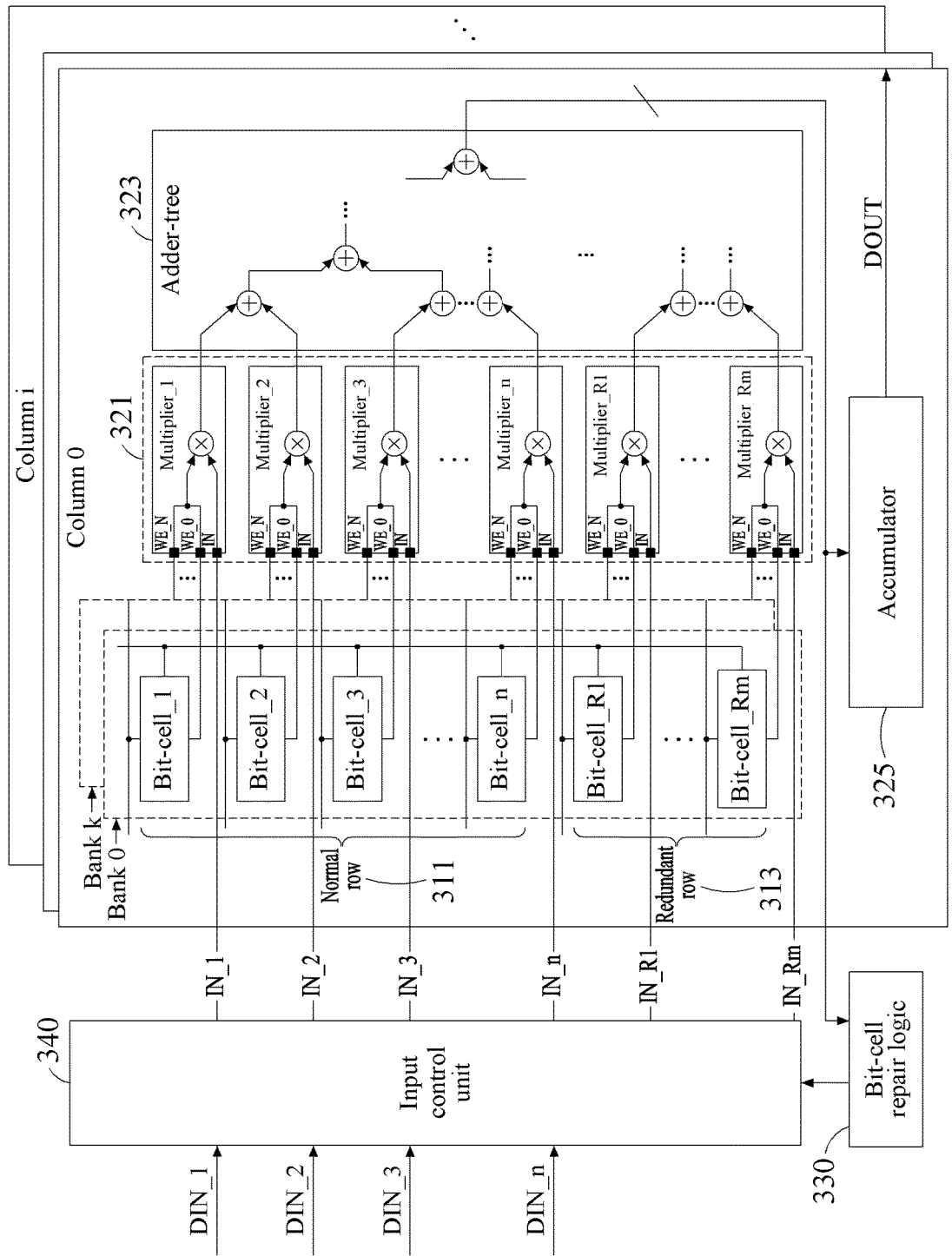
FIG. 3 illustrates an example memory device in an IMC system, according to one or more embodiments.

FIG. 3 illustrates example structure of a memory device in an IMC system, according to one or more embodiments.

The description provided with reference to FIGS. 1 and 2 may be applicable to the example of FIG. 3 and description thereof may be referred to.

Referring to FIG. 3, the memory device according to an example may be configured with columns (e.g., column 0 to column i, where i is a natural number). Each column may include its own (i) banks (e.g., bank 0 to bank k, where k is a natural number) and (ii) a single operator shared by the column's banks. The operator according to an example may include a multiplier 321, an adder tree 323, and an accumulator 325.

Each of the banks in a column, according to an example, may include a set of bit-cells. The bit-cells in a set, according to an example, may include normal bit-cells 311 and one or more redundant bit-cells 313. A redundant bit-cell 313, according to an example, may be a bit-cell capable of replacing one or more of the normal bit-cells 311 when they are determined to be defective.

The memory device, according to an example, may receive input data from a system and transmit output data to the system. For example, in FIG. 3, the memory device may receive n inputs (e.g., DIN) from the system and output i outputs (e.g., DOUT) to the system. The memory device according to an example may perform an operation by converting a multi-bit input (e.g., DIN_x) into a 1-bit input (e.g., IN_x). The converting, for example, may involve the memory device performing an operation according to a bit-serial method where bits of multi-bit input are processed serially.

A bank, according to an example, may store first data. The storage of data in the bank may involve storing the data in each of the bit-cells included in the bank. The first data, according to an example may be, for example, a weight value. The multiplier 321 according to an example may receive second data from an input control unit 340. The second data, according to an example may be, for example, an input activation value, and may be referred to as an "input" hereinafter. As described herein, the example in which the first data is a weight value and the second data is an input activation value has been described, but the example is not limited thereto. The types of the first data and the second data may vary depending on the configuration, application, etc.

The operator according to an example may perform an operation (e.g., the MAC operation) between the first/weight data received from the bit-cells included in each of the banks and the second/activation data received from the input control unit 340. For example, the operator according to an example may operate on both the input activation value and the weight value by a bit-serial method, and 16 cycles may be used to operate on a 4-bit input activation value and on a 4-bit weight value. However, the operation method is not limited to the bit-serial method described above.

As described above, the banks of the memory device, according to an example, may share a single operator. For example, each of bank 0 to the bank k may use one the same multiplier 321, adder tree 323, and accumulator 325.

The repairer 330, according to an example, may detect a position of a defective bit-cell by using a feature related to the banks sharing a single operator. Furthermore, when the position of the defective bit-cell can be specified, the memory device according to an example may repair the bit-cell by allocating the bit-cell to a redundant bit-cell 313. The allocation of the bit-cell to a redundant bit-cell 313 may have the same meaning as (or be a part of) the allocation of a row corresponding to the bit-cell to a row corresponding to the redundant bit-cell 313.

More specifically, the repairer 330, according to an example, may generate a test pattern for searching for a defective bit-cell. The test pattern may be hard-wired into the repairer 330, for example, or the repairer 330 may have its own non-volatile storage/memory for storing a test pattern. The test pattern according to an example may be divided into a first test pattern and a second test pattern according to an input position. A test pattern stored in the bit-cell may be referred to as the first test pattern, and a test pattern applied to the operator may be referred to as the second test pattern. Furthermore, the first test pattern may be referred to as a weight pattern. In the example of an operator that performs an in-memory MAC operation, the first and second test pattern may be respective operands for the MAC operation.

The repairer 330 may generate test patterns in various forms. For example, when a defect is searched for during factory calibration or power-on (which might be a one-time test), there may be no problem using any arbitrary type of test pattern. However, when an efficient or optimal algorithm (e.g., binary search) is applied to a task which needs to check a defect frequently, a test time may be rapidly reduced.

The repairer 330 according to an example may store an expected operation value corresponding to the test pattern (a value that would be produced if there are no defects, e.g., an expected correct value of a MAC operation performed on the first and second test patterns), check for defective bit-cells of all columns by comparing the expected operation value with a result obtained by performing the operation using the test pattern, and then determine how to repair any defective bit-cells.

Since an operation result of the memory device according to an example is generally full precision, a defect may be determined using a MAC operation result without a reading operation of a bit-cell by using a sense amplifier. For example, for a MAC operation on 64 pieces of 4-bit inputs and 4-bit weights, a result may be 14 bits.

There may be at least two types of defect, according to a position in the memory device where a defect has occurred. More specifically, a defect may occur in two places; either the memory for storing data or the operator for performing the MAC operation, for example. Therefore, the memory device may distinguish whether a defect has occurred in the memory (e.g., bit-cells) or in the operator.

In order to increase a memory density, the memory device, according to an example, may have a structure in which multiple bit-cells share a single operator. Such a structure may be referred to as a multi-bank structure (bit-cells of multiple banks share an operator). In the structure in which bit-cells share a single operator, when MAC operation failures with the same pattern have occurred in the bit-cells, the memory device may determine that the operator has a problem and remediate accordingly.

If conditions indicate that there is no problem in the operator, the memory device may store the first test pattern in the bit-cells and apply the second test pattern as the input activation value to perform the MAC operation on the test patterns. A defective bit-cell may be found through the MAC operation result and may be repaired, for example, by allocating a row corresponding to the defective bit-cell to a row corresponding to the redundant bit-cell 313.

The redundant bit-cell 313 may be operable with (e.g., connected with) the operator by default such that the redundant bit-cell 313 is used in the MAC operation even when there is no defect; when there is no defect the redundant bit-cell 313 may be rendered inert (in effect, not used) by setting a corresponding weight and/or input activation as a predetermined value (e.g., "0") so as not to affect the final value produced by the MAC operation. In other words, the redundant bit-cell 313 may be active/available and yet effectively dormant until needed to address a defect.

Figure 4:
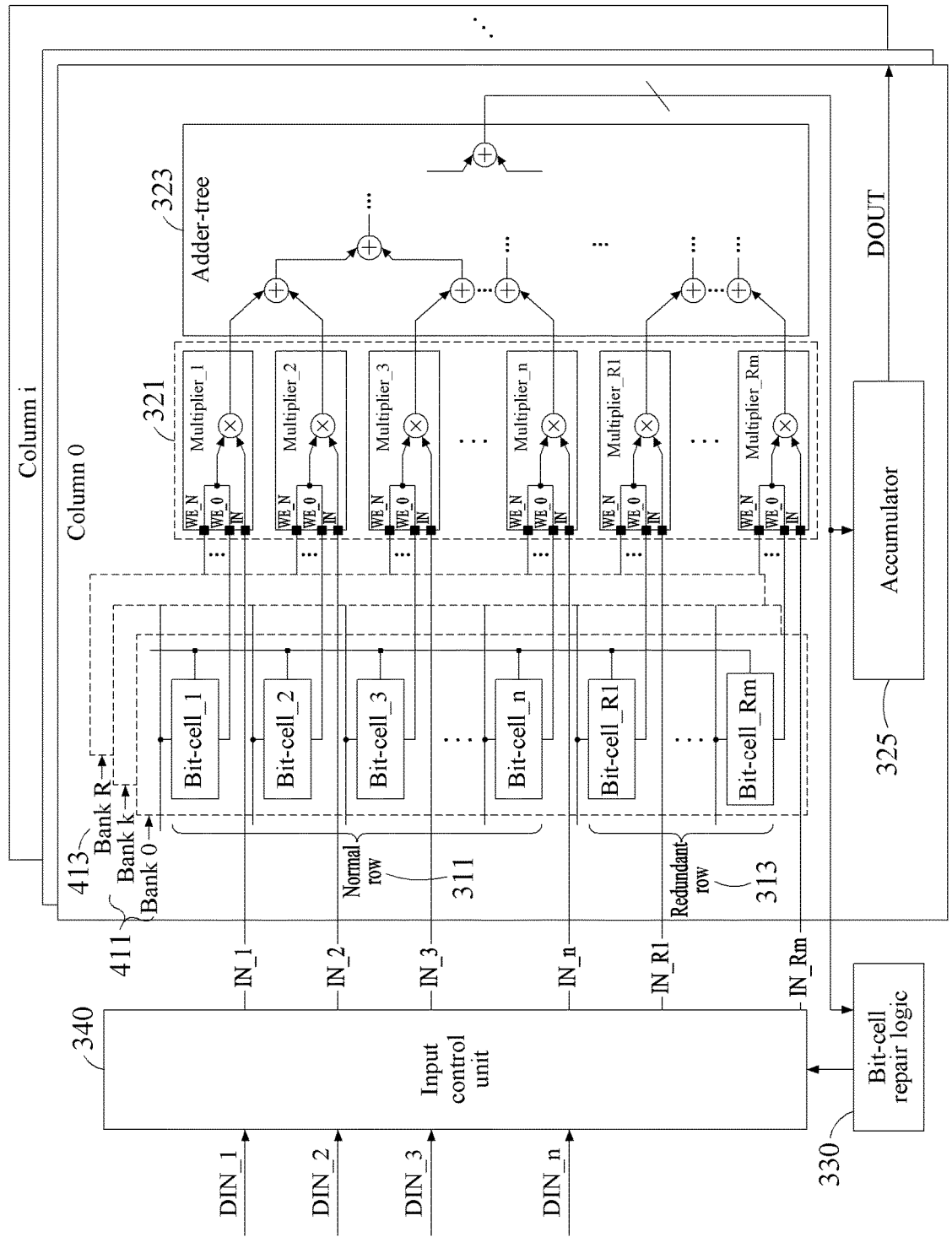
FIG. 4 illustrates an example of a memory device in an IMC system, according to one or more embodiments.

FIG. 4 illustrates an example structure of a memory device in an IMC system, according to one or more embodiments.

The description provided with reference to FIGS. 1 to 3 is applicable to the example of FIG. 4.

Referring to FIG. 4, the memory device according to an example may be configured with columns (e.g., a column 0 to a column i of FIG. 4, where i is a natural number). Each column may include a respective plurality of banks and a respective single operator shared by the banks in its plurality of banks. The operator may include the multiplier 321, the adder tree 323, and the accumulator 325.

A column's plurality of banks may include normal banks 411 (e.g., a bank 0 to a bank k of FIG. 4) and one or more redundant bank(s) 413 (e.g., a bank R). The redundant bank(s) 413 may be for replacing one or more of the normal banks 411 when they are defective. FIG. 4 illustrates one redundant bank 413 (bank R), but there may be more than one per column.

When a position of a defective bit-cell is specified (by pattern testing or otherwise), the memory device, according to an example, may repair the defective bit-cell by allocating a bank corresponding to the defective bit-cell to the redundant bank 413. When the position of the defective bit-cell is specified, the repairer 330 may determine which of the redundant bit-cell 313 and the redundant bank 413 the defective bit-cell is to be allocated to.

For example, when it is determined that a plurality of bit-cells included in a specific bank are defective, the repairer 330 according to an example may determine that it is more efficient to allocate the entire bank (with the defects) to the redundant bank 413, in contrast to allocating each of the defective bit-cells to the redundant bit-cell 313. Alternatively, when one bit-cell is defective, the repairer 330 according to an example may determine that it is more efficient to allocate the bit-cell to the redundant bit-cell 313, compared to allocation of the bank to the redundant bank 413. In other words, allocation may be bit-wise, or bank-wise.

The redundant bank 413 according to an example may be included in (or operatively coupled with) the operator by default such that the redundant bank 413 is used in the MAC operation, and when the redundant bank 413 is not used, a corresponding weight and/or input activation may be set as a predetermined value (e.g., "0") so that the redundant bank 413 does not to affect the MAC operation.

Figure 5:
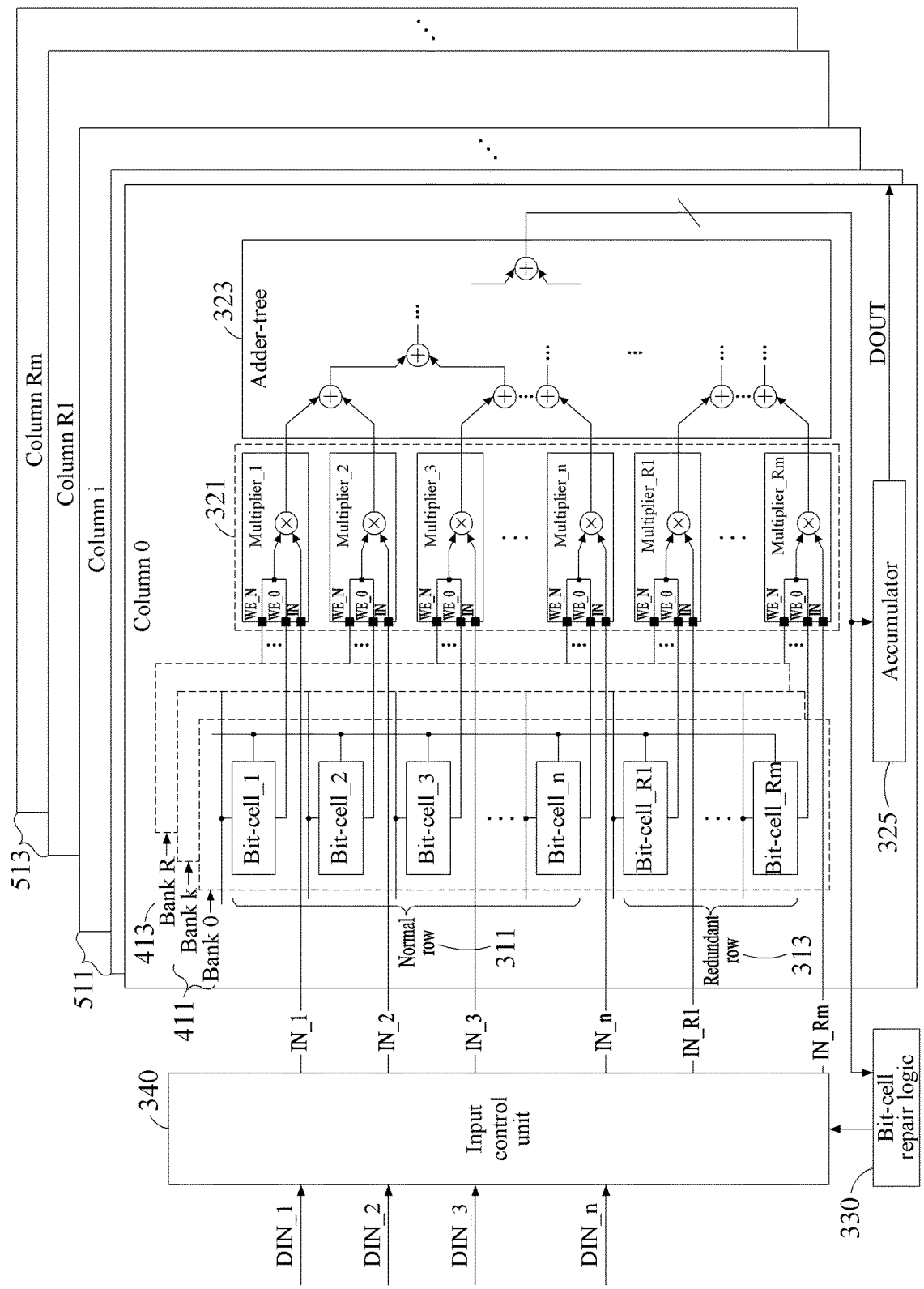
FIG. 5 illustrates an example of a memory device in an IMC system, according to one or more embodiments.

FIG. 5 illustrates an example structure of a memory device in an IMC system, according to one or more embodiments.

The description provided with reference to FIGS. 1 to 4 is applicable to the example of FIG. 5.

Referring to FIG. 5, the memory device, according to another example, may be configured with a plurality of columns. Each column may include its own plurality of banks and its own single operator shared by banks in its plurality of banks. The operator may include the multiplier 321, the adder tree 323, and the accumulator 325.

The memory device may include normal (non-redundancy) columns 511 (e.g., column 0 to column i of FIG. 5) and one or more redundant column(s) 513 (e.g., column R1 to column Rm). The redundant column(s) 513 may be for replacing one or more of the normal columns 511 when they are defective.

When a position or location of a defective bit-cell is specified, the memory device may repair or remedy the bit-cell by allocating a column corresponding to the bit-cell to the redundant column 513. When the position of the defective bit-cell is specified, the repairer 330 may determine which of the redundant bit-cell 313, the redundant bank 413, or the redundant column 513 the bit-cell is to be allocated to.

For example, when it is determined that bit-cells included in a specific column's banks are defective, the repairer 330 may determine that it is more efficient to allocate the column to the redundant column 513, compared to allocation of each of the defective bit-cells to the redundant bit-cell 313. Alternatively, when the operator is defective, the repairer 330 according to an example may repair the defective operator by allocating a column corresponding to the defective operator to the redundant column 513.

A method of determining which of the memory and the operator is defective by using the test pattern is described below with reference to FIGS. 6 and 7.

Figure 6:
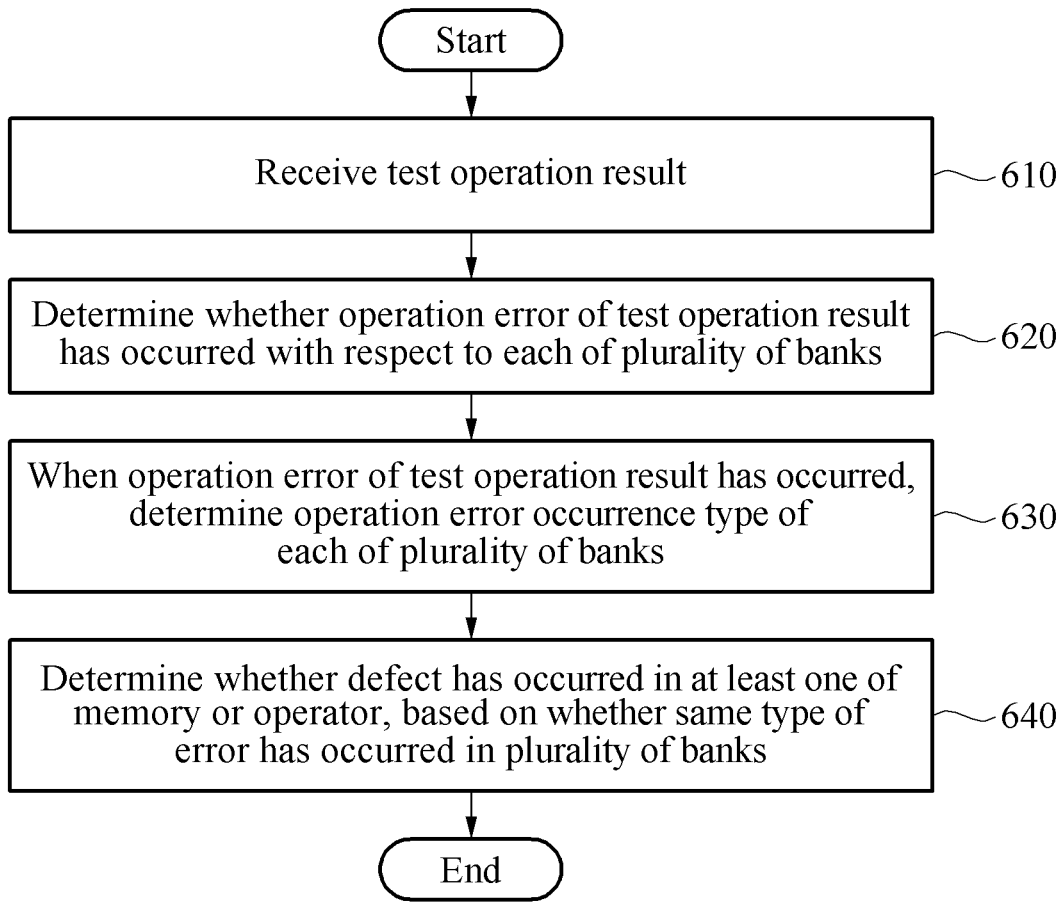
FIG. 6 illustrates an example of an operating method of a memory device, according to one or more embodiments.

FIG. 6 illustrates an example of an operating method of a memory device, according to one or more embodiments.

Operations 610 to 640 may be performed by the memory device 200 shown in FIG. 2, or by another suitable electronic device in a suitable system.

Furthermore, although the operations of FIG. 6 may be performed in the shown order and manner, the order of some operations may be changed or omitted without departing from the spirit and scope of the shown example. Operations shown in FIG. 6 may be performed in parallel or simultaneously.

In operation 610, the memory device 200 according to an example may receive a test operation result (e.g., a result of performing a MAC operation on test data). In order to determine whether/where there is a defect in the memory device 200, a repairer (e.g., the repairer 230 of FIG. 2) of the memory device 200 may generate a first test pattern stored in a memory (e.g., the memory 210 of FIG. 2) and a second test pattern applied to an operator (e.g., the operator 220 of FIG. 2). That is, the first and second test patterns may be concurrent operands of the operator. The operator according to an example may perform a test operation based on the first test pattern and the second test pattern (the test patterns may serve as MAC operands). The test operation may involve using the test pattern to determine whether/where there is a defect. The repairer may receive a result of the test operation from the operator.

In operation 620, the memory device 200 according to an example may determine whether an operation error of the test operation result has occurred with respect to each of the banks. The repairer may store an expected operation value corresponding to the test pattern. The expected operation value may be provided for each bit-cell. For each of the banks, the repairer may determine whether an operation error of the test operation has occurred by comparing the test operation result with the expected operation value. The repairer may determine whether an operation error has occurred for each bit-cell.

In operation 630, when an operation error of the test operation result has occurred, the memory device 200 according to an example may determine an operation error occurrence type for each of the plurality of banks. The memory device 200 may determine whether the same type of error has occurred in bit-cells included in the banks. Types of errors are described below.

In operation 640, the memory device 200 may determine whether a defect has occurred in the memory or the operator, based on whether the same type of error has occurred in the bit-cells included in the banks.

When the same type of error has occurred in the bit-cells included in the banks, the repairer may determine that the operator is defective, because the banks of the memory device 200 share a single operator.

On the other hand, when different types of errors have occurred in the bit-cells included in the plurality of banks, the repairer according to an example may determine that the memory (e.g., each bit-cell) is defective.

When an operation at low voltage (e.g., 0.5 V or less) is performed to maximize power efficiency (e.g., TOPS/W), a defect is highly likely to occur due to a decrease in a write margin, but the possibility of operation may be increased according to the method of determining the defect.

In addition to determining a defect in a production stage of the memory device according to an example, a defect may also be determined in a use stage after the memory device is mounted on an electronic device. For example, the memory device 200 may be mounted on an electronic device, such as a data center, a mobile device, an Internet of Things (IoT) device, or the like, and according to operations 610 to 640, the detection of a defect of the memory device 200 and the repair/remediation of the defect may be performed while the electronic device is being used.

Figure 7:
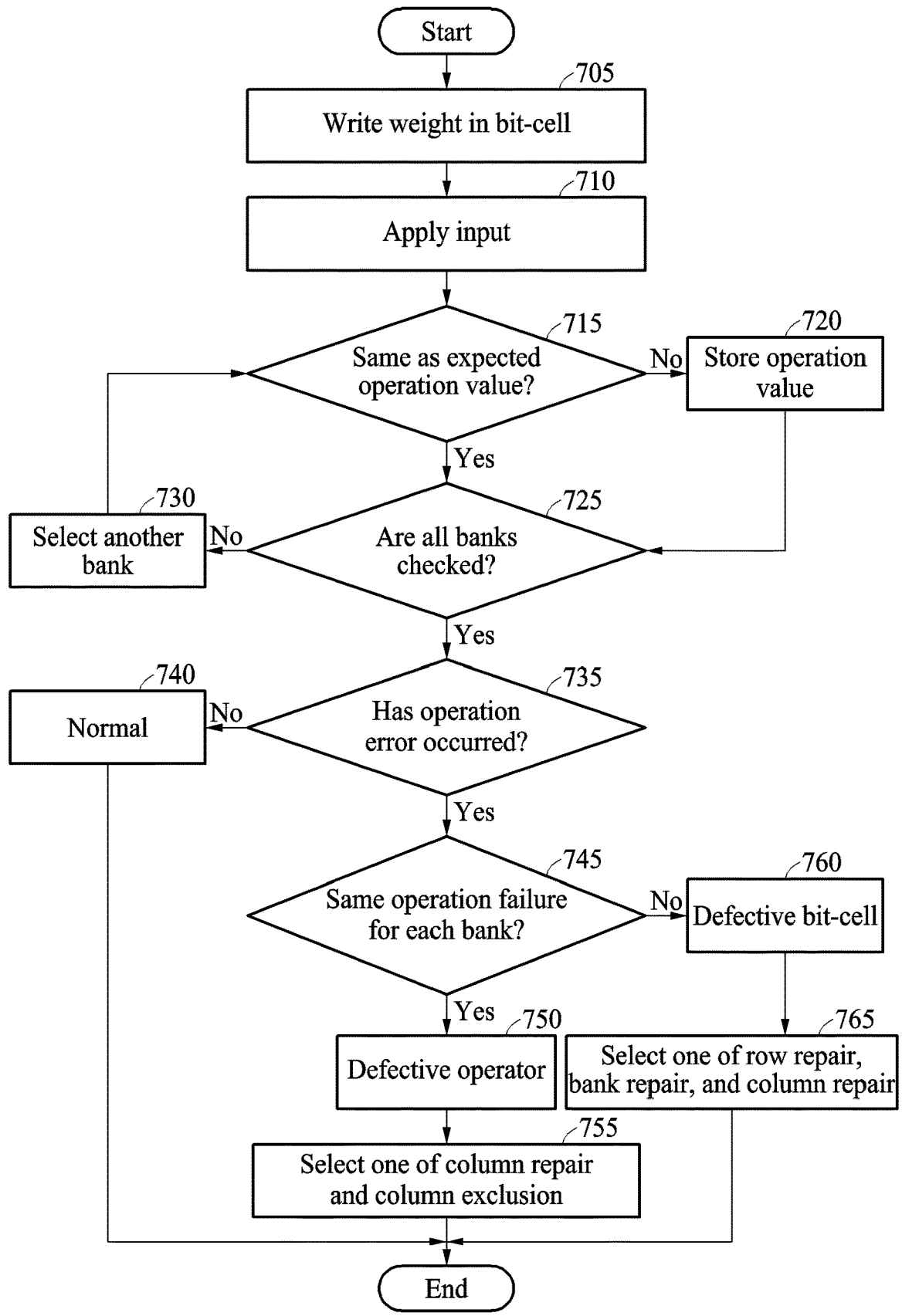
FIG. 7 illustrates an example of a method of detecting and repairing a defect of a memory device, according to one or more embodiments.

FIG. 7 illustrates an example of a method of detecting and repairing a defect of a memory device, according to one or more embodiments.

Operations 705 to 765 are described as being performed using the memory device 200 shown in FIG. 2. However, operations 705 to 765 may be performed by another suitable electronic device in a suitable system.

Furthermore, operations of FIG. 7 may be performed in the shown order and manner. However, the order of some operations may be changed or omitted without departing from the spirit and scope of the shown example. Operations shown in FIG. 7 may be performed in parallel or simultaneously.

In operation 705, the memory device 200 according to an example may write a weight into a bit-cell (the "weight" may be test data that is not necessarily part of a neural network, and the term "weight" is used illuminate the technique rather than limit the type of test data that may be used). Here, the weight may be a value of the first test pattern.

In operation 710, the memory device 200 may apply an input. Here, the input may be the second test pattern.

In operation 715, the memory device 200 may compare whether a test operation result is the same as an expected operation value associated with the test pattern.

In operation 720, the memory device 200 may store an operation value, based on the determination that the test operation result is different from the expected operation value. The operation value herein may the test operation result.

In operation 725, at an iteration control point, the memory device 200 may determine whether all banks have been checked, based on the determination that the test operation result is the same as the expected operation value.

In operation 730, the memory device 200 may select another/next bank based on the determination that all banks are not checked. Through operations 725 and 730, the memory device 200 may complete the comparisons between the test operation result of each bank and the expected operation value.

In operation 735, the memory device 200 may determine whether an operation error has occurred.

In operation 740, the memory device 200 may finish the defect determination procedure based on the determination that an operation error has not occurred (a "normal" termination).

In operation 745, the memory device 200 according to an example may determine whether the same operation failure has occurred for each bank, based on the determination that the operation error has occurred.

In operation 750, the memory device 200 may determine that a defect has occurred in the operator, based on a determination that the same operation failure has occurred for each bank. This is because, as described above, the banks of the memory device 200 share a single operator.

In operation 755, the memory device 200 may repair/remediate a column corresponding to the operator or exclude the column corresponding to the operator from operation (e.g., disable the column), based on the determination that a defect has occurred in the operator. More specifically, the memory device 200 according to an example may perform the repair by allocating the column corresponding to the operator (e.g., including the operator), which is defective, to a redundant column (e.g., the redundant column 513 of FIG. 5). Alternatively, the memory device 200 according to an example may exclude (e.g., deactivate) the column corresponding to the operator, which is defective, from the operation of the memory device 200.

In operation 760, the memory device 200 may determine that a defect has occurred in a bit-cell, based on a determination that there is not a same operation failure for each bank. Since the same operation failure has not occurred in the bit-cells included in the bank, the memory device 200 according to an example may determine that the defect is a type where there is a problem in each of the bit-cells that are defective.

In operation 765, the memory device 200 according to an example may select one of a row repair, bank repair, and column repair. Here, the row repair, bank repair, and column repair may respectively refer to allocation of a row corresponding to a defective bit-cell to a redundant row (e.g., the redundant bit-cell 313 of FIG. 3), allocation of a bank corresponding to a defective bit-cell to a redundant bank (e.g., the redundant bank 413 of FIG. 4), and allocation of a column corresponding to a defective bit-cell to a redundant column (e.g., the redundant column 513 of FIG. 5). Hereinafter, the redundant row, redundant column, and redundant bank are collectively referred to as a redundant component.

Figure 8:
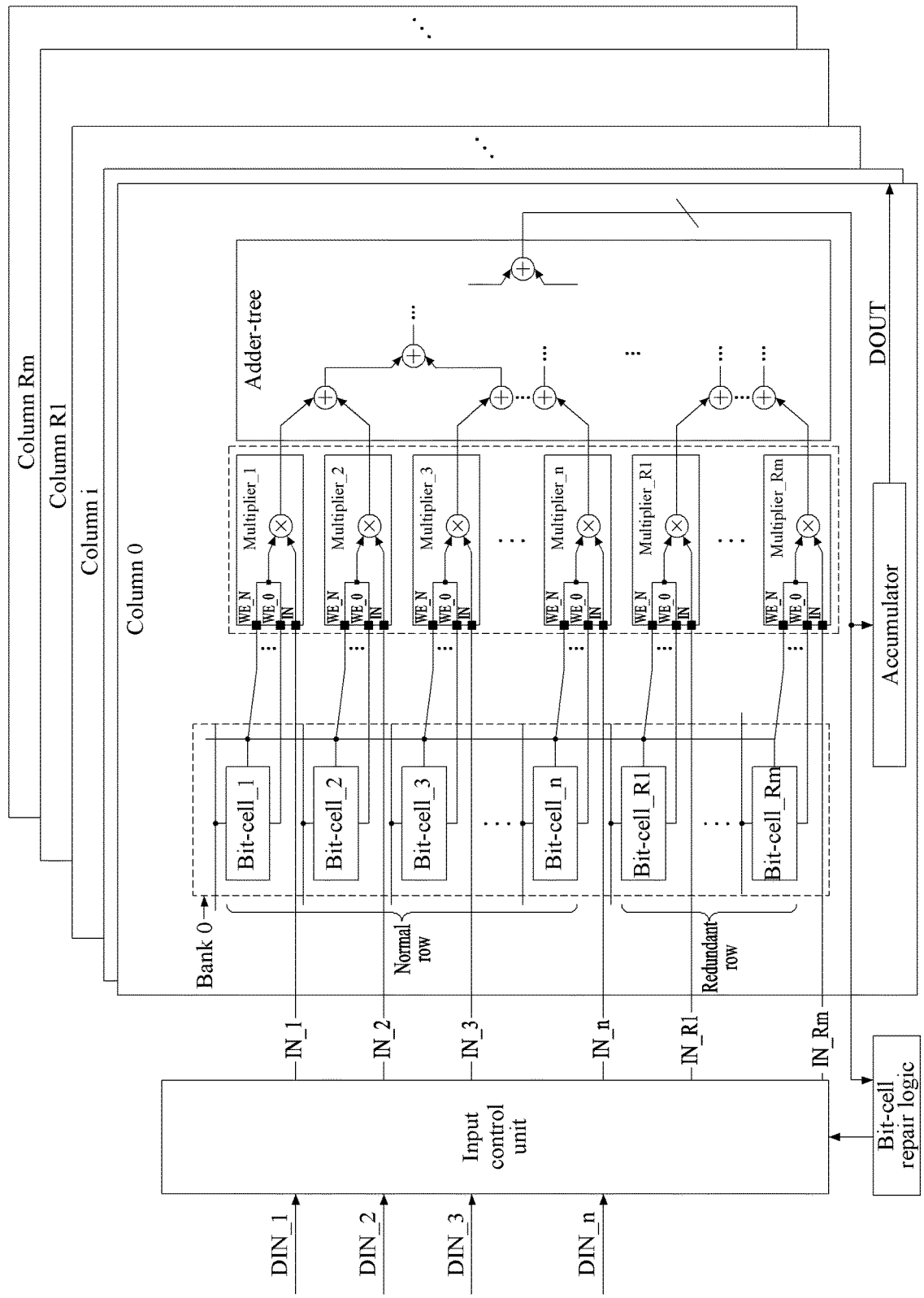
FIG. 8 illustrates an example of a memory device in an IMC system, according to one or more embodiments.

FIG. 8 illustrates an example structure of a memory device in an IMC system, according to one or more embodiments.

Referring to FIG. 8, a memory device according to an example may be configured with columns. In the example of FIG. 8, each column of the memory device of FIG. 8 may include only one respective bank (e.g., a bank 0 of FIG. 8) and one respective operator.

The bank of a column includes its own bit-cells. The bit-cells of a column may include normal bit-cells and one or more redundant bit-cell(s). The redundant bit-cell according to an example may be a bit-cell for replacing one or more of the normal bit-cells when they are defective.

The memory device may include normal columns (e.g., a column 0 to a column i of FIG. 5) and one or more redundant column(s) (e.g., column R1 to column Rm). The redundant column(s) according to an example may be for replacing one or more of the normal columns when the normal columns are defective.

When the position of a defective bit-cell is specified, the memory device according to an example may repair/remediate the defective bit-cell by allocating the defective bit-cell (or a column corresponding thereto) to a redundant bit-cell or a redundant column. Hereinafter, a method of detecting a defect in a memory device composed of one bank and one operator per column will be described in detail with reference to FIGS. 9 and 10.

Figure 9:
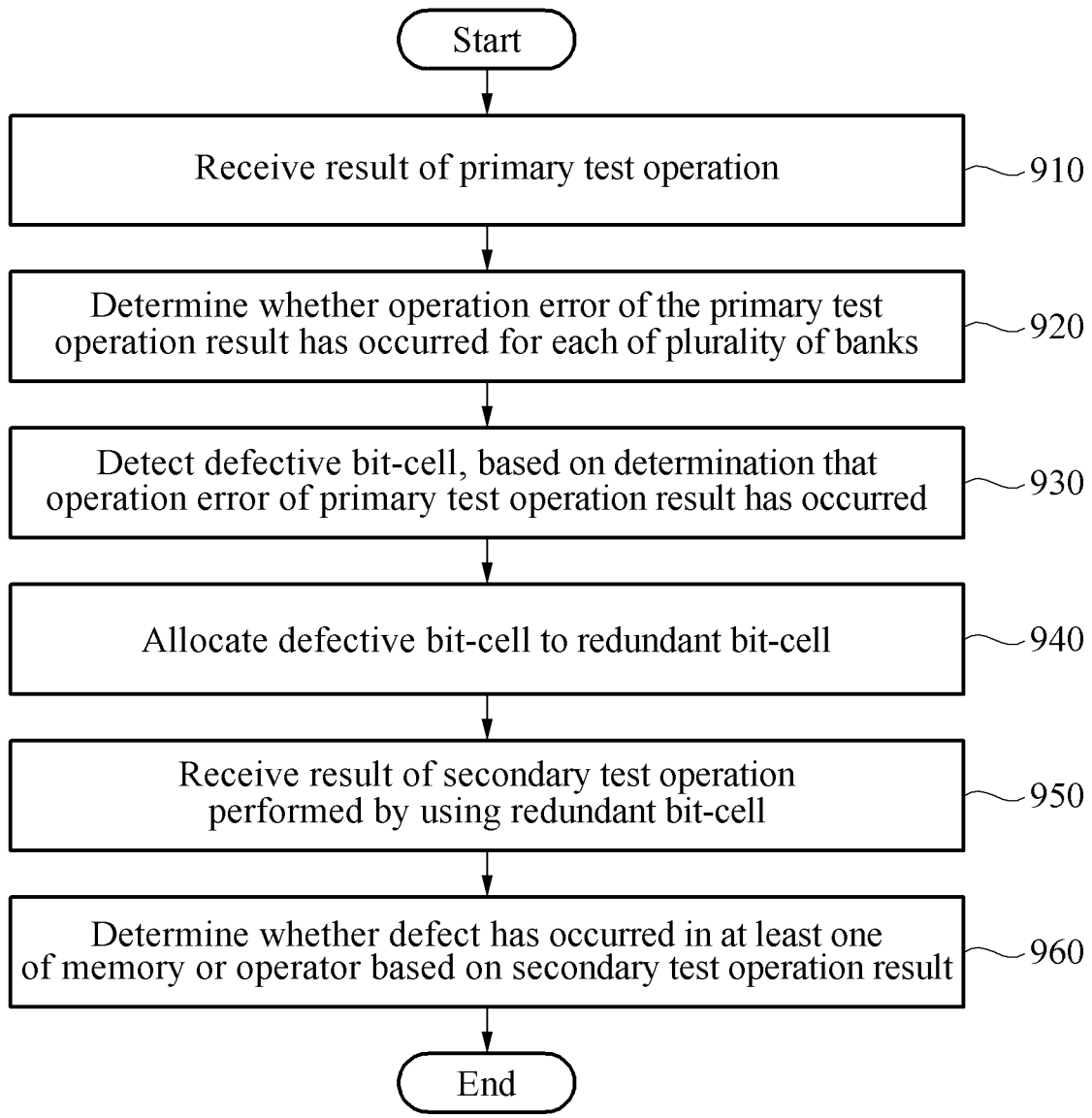
FIG. 9 illustrates an example of an operating method of a memory device, according to one or more embodiments.

FIG. 9 illustrates an example of an operating method of a memory device, according to one or more embodiments.

Operations 910 to 960 are described as performed by the memory device shown in FIG. 8. However, operations 910 to 960 may be performed by another suitable electronic device in a suitable system. Furthermore, the operations of FIG. 9 may be performed in the shown order and manner. However, the order of some operations may be changed or omitted without departing from the spirit and scope of the shown example. Operations shown in FIG. 9 may be performed in parallel or simultaneously.

In operation 910, the memory device, according to an example, may receive a result of a primary test operation. A repairer of the memory device may generate a first test pattern stored in a memory and a second test pattern applied to an operator to determine whether there is a defect. The operator may perform a primary test operation based on the first test pattern and the second test pattern. The primary test operation is to be distinguished from, and precede, a secondary test operation, described below (e.g., for verifying a repair/remediation).

In operation 920, the memory device may determine whether an operation error of the primary test operation result has occurred for each bank. The repairer may store an expected operation value corresponding to the test pattern (e.g., a correct MAC result). The expected operation value may be provided for each bit-cell. The repairer may determine whether an operation error of the primary test operation result has occurred for each bit-cell by comparing the test operation result of the bit-cell with the corresponding expected operation value.

In operation 930, the memory device may detect a defective bit-cell based on the determination that the operation error of the primary test operation result has occurred.

In operation 940, the memory device may allocate the defective bit-cell to a redundant bit-cell (e.g., bit-cell_R1 to bit-cell_Rm of FIG. 8), i.e., remediate the determined defect.

In operation 950, the memory device may receive a result of the secondary test operation (e.g., a second MAC operation on the pattern data) performed by using the redundant bit-cell. The memory device may store the first test pattern in bit-cells including the redundant bit-cell, which is allocated instead of the defective bit-cell, and may apply the second test pattern to the operator. The test pattern used for the secondary test operation according to an example may be the same as the test pattern used for the primary test operation. The operator may perform the secondary test operation based on the first test pattern and the second test pattern.

In operation 960, the memory device may determine whether a defect has occurred in either the memory or the operator based on the secondary test operation result. An error which has occurred again, despite the test operation having been performed by using the redundant bit-cell, may imply that the defect has not occurred due to the bit-cell. Accordingly, when the operation error of the secondary test operation result has occurred, the memory device according to an example may determine that the operator is defective.

Furthermore, when an operation error does not occur for the secondary test the defect may be presumed to be repaired through the redundant bit-cell, and thus it may be confirmed that there was a problem on the bit-cell detected based on the primary test operation result.

The memory device may repair a column corresponding to the operator based on the determination that the operator is defective. Alternatively, the memory device may exclude the column corresponding to the operator from the general operation of the memory device based on the determination that the operator is defective.

Figure 10:
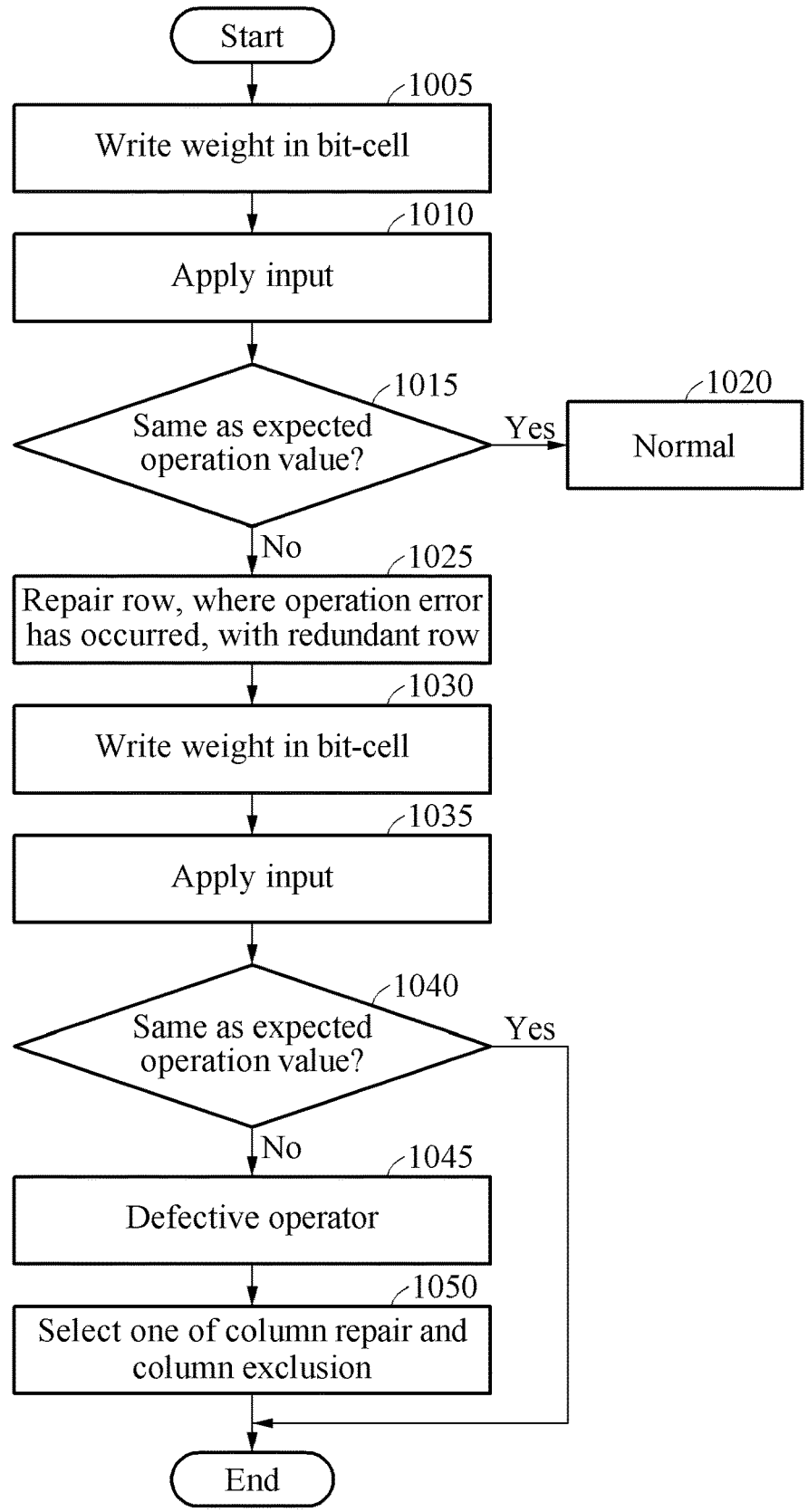
FIG. 10 illustrates a method of detecting and repairing a defect of a memory device, according to one or more embodiments.

FIG. 10 illustrates a method of detecting and repairing a defect of a memory device, according to one or more embodiments.

Operations 1005 to 1050 are described as being performed using the memory device shown in FIG. 8. However, operations 1005 to 1050 may be performed by another suitable electronic device in a suitable system.

Furthermore, the operations of FIG. 10 may be performed in the shown order and manner. However, the order of some operations may be changed or omitted without departing from the spirit and scope of the shown example. Operations shown in FIG. 10 may be performed in parallel or simultaneously.

In operation 1005, the memory device according to an example may write a weight in a bit-cell. Here, the weight may be the first test pattern.

In operation 1010, the memory device may apply an input. Here, the input may be the second test pattern.

In operation 1015, the memory device may compare whether a primary test operation result is the same as an expected operation value.

In operation 1020, the memory device may determine that the memory device is normal, based on the determination that the primary test operation result is the same as the expected operation value.

In operation 1025, the memory device may repair a row where the operation error has occurred with a redundant row, based on the determination that the primary test operation result is different from the expected operation value. The redundant row may be a row corresponding to a redundant bit-cell.

In operation 1030, the memory device may write a weight in a bit-cell. Herein, the bit-cell may be a bit-cell including the redundant bit-cell, which is allocated instead of the bit-cell, which is determined to be defective, and the weight may be the first test pattern.

In operation 1035, the memory device may apply an input. Here, the input may be the second test pattern.

In operation 1040, the memory device may determine whether a secondary test operation result is the same as an expected operation value.

In operation 1045, when the secondary test operation result is different from the expected operation value, the memory device may determine that the operator is defective because there is still a problem even after the bit-cell is repaired.

In operation 1050, the memory device may repair a column corresponding to the operator (or exclude the column corresponding to the operator from the operation), based on the determination that the operator is defective. More specifically, the memory device may perform the repair by allocating the column corresponding to the operator (e.g., including the operator), which is defective, to a redundant column (e.g., a column R1 to a column Rm of FIG. 8). Alternatively, the memory device may exclude the column corresponding to the operator, which is defective, from the operation.

It should be noted that the defect detection techniques using patterns described herein are themselves useful regardless of how or whether repair is performed. Similarly, the repair techniques described herein are useful on their own independent of how a defect is identified.

Moreover, defect repair/remediation may be performed with a variety of techniques. For example, a redundant (auxiliary) component having one or more redundant bit-cell(s) may be wired (before use for repair) to the memory device and participate in MAC operations without contributing any data to a MAC result (e.g., by storing zeroes). Such components may be activated/allocated for repair by enabling the redundant bit-cell(s) to be written-to (i.e., to store input/weight data) in place of the bit-cell(s) that they replace. Similarly, defective bit-cell(s) may be effectively deactivated by, for example, causing them to persistent store a value (e.g., 0) that causes them to be inert with respect to any MAC operations, and by preventing them from storing any new input/weight data. Other methos may be used for repair. For example, in some embodiments, a circuit path including a defective bit-cell may be switched or reconfigured to exclude the defective bit-cell and instead include a redundant bit-cell. In other embodiments, which non-redundant and redundant components (e.g., bit-cell(s), banks, columns, etc.) are active/enabled and which are inactive/disabled may be controlled by controlling which components receive power during MAC computation, for example.

The computing apparatuses, the electronic devices, the processors, the memories, the displays, the information output system and hardware, the storage devices, and other apparatuses, devices, units, modules, and components described herein with respect to FIGS. 1-10 are implemented by or representative of hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 1-10 that perform the operations described in this application are performed by computing hardware, for example, by one or more processors or computers, implemented as described above implementing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions or software include machine code that is directly executed by the one or more processors or computers, such as machine code produced by a compiler. In another example, the instructions or software includes higher-level code that is executed by the one or more processors or computer using an interpreter. The instructions or software may be written using any programming language based on the block diagrams and the flow charts illustrated in the drawings and the corresponding descriptions herein, which disclose algorithms for performing the operations that are performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access programmable read only memory (PROM), electrically erasable programmable read-only memory (EEPROM), random-access memory (RAM), dynamic random access memory (DRAM), static random access memory (SRAM), flash memory, non-volatile memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, blue-ray or optical disk storage, hard disk drive (HDD), solid state drive (SSD), flash memory, a card type memory such as multimedia card micro or a card (for example, secure digital (SD) or extreme digital (XD)), magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents.

Therefore, in addition to the above disclosure, the scope of the disclosure may also be defined by the claims and their equivalents, and all variations within the scope of the claims and their equivalents are to be construed as being included in the disclosure.

What is claimed is:

1. A memory device comprising:
    a memory comprising banks, wherein each bank comprises a respective plurality of bit-cells;
    an in-memory computation (IMC) operator configured to perform an IMC operation between first data while the first data is in the bit-cells of the memory and second data received as input to the memory device, wherein the banks share the operator; and
    wherein the memory device is configured to:
        generate a first test pattern that is stored in the memory and generate a second test pattern applied to the IMC operator, and based thereon determine whether a defect has occurred in either the memory or the operator, and
        perform a repair based on the determination that a defect has occurred.

2. The memory device of claim 1, wherein the memory device is further configured to store the first test pattern in the bit-cells of the memory and apply the second test pattern to the IMC operator, and
    wherein the IMC operator is further configured to receive the first test pattern from the memory and perform a test operation between the first test pattern and the second test pattern.

3. The memory device of claim 2, wherein the memory device is further configured to obtain a result of the test operation from the IMC operator and determine based thereon whether an operation error of the result of the test operation has occurred for each of the banks.

4. The memory device of claim 3, further configured to, in response to determining that an operation error has not occurred, determine that no defect has occurred in the memory and no defect has occurred in the operator.

5. The memory device of claim 3, further configured to, in association with determining that an operation error has occurred, based on a same type of error occurring in each of the banks, determine that the defect has occurred in the operator.

6. The memory device of claim 5, further configured to repair a column corresponding to the operator, based on the determination that the defect has occurred in the IMC operator.

7. The memory device of claim 5, further configured to exclude a column comprising the IMC operator from further performing the IMC operation based on the determination that the defect has occurred in the IMC operator.

8. The memory device of claim 3, further configured to, based on determining that the operation error has occurred, based on a same type of error not occurring in each of the banks, determine that the defect has occurred in the memory.

9. The memory device of claim 8, further configured to:
    detect a defective bit-cell based on the determination that a defect has occurred in the memory; and
    determine a repairing method corresponding to the defective bit-cell.

10. The memory device of claim 9, wherein
    each of the banks further respectively comprises one or more redundant bit-cells, and
    the memory device is configured to allocate a row corresponding to the defective bit-cell to a row comprising a redundant bit-cell.

11. The memory device of claim 10, further configured to store a predetermined weight in the redundant bit-cell before the allocating.

12. The memory device of claim 9, wherein
the memory further comprises a redundant bank, and
the memory device is configured to allocate a bank corresponding to the defective bit-cell to the redundant bank.

13. The memory device of claim 9, wherein
the memory further comprises a redundant column, and
the repairer is configured to allocate a column corresponding to the defective bit-cell to the redundant column.

14. A method of operating a memory device comprising an operator and comprising a memory comprising banks, the method comprising:
receiving a result of a test operation;
based on the result, determining whether an operation error has occurred for each of the banks;
in response to determining that the operation error has occurred, determining an operation error type for of each of the plurality of banks; and
determining whether there is a defect in either the memory or the operator based on whether the same operation error type has occurred in bit-cells included in the banks.

15. The method of claim 14, wherein the operator is configured to perform a computation operation directly on each of the banks.

16. The method of claim 14, wherein when determined that the same error type has occurred in the bit-cells included in the banks, determining that the defect has occurred in the operator.

17. The method of claim 16, further comprising:
repairing a column corresponding to the operator based on the determination that the defect has occurred in the operator.

18. The method of claim 16, further comprising:
excluding a column corresponding to the operator from an operation based on the determination that the defect has occurred in the operator.

19. The method of claim 14, wherein the determining of whether there is a defect comprises:
based on the same operation error type not occurring in each of the plurality of banks, determining that there is a defect in the memory.

20. The method of claim 19, further comprising:
detecting a defective bit-cell based on the determination that there is a defect in the memory; and
allocating a component corresponding to the defective bit-cell to a redundant component of the memory device.

21. A method of operating a memory device comprising a memory comprising banks, the banks comprising bit-cells, an operator, and a redundant bit-cell, the method comprising:
receiving a primary test operation result;
for each of the banks, determining whether an operation error of the primary test operation result has occurred, and based thereon, detecting a defective bit-cell of one of the banks;
allocating the detected defective bit-cell to the redundant bit-cell;
receiving a result of a secondary test operation performed obtained using the redundant bit-cell; and
based on the result of the secondary test operation, determining whether a defect has occurred in the memory or in the operator.

22. The method of claim 21, wherein the determining of whether a defect has occurred comprises:
based an operation error of the result of the secondary test operation, determining that a defect has occurred in the operator.

23. The method of claim 22, further comprising:
repairing a column corresponding to the operator based on the determination that the defect has occurred in the operator.

24. The method of claim 22, further comprising:
excluding a column corresponding to the operator from an operation, based on the determination that the defect has occurred in the operator.

25. A non-transitory computer-readable storage medium storing instructions that, when executed by a processor, cause the processor to perform the method of claim 14.

* * * * *